United States Patent
Nickel et al.

(10) Patent No.: US 7,776,682 B1
(45) Date of Patent: Aug. 17, 2010

(54) ORDERED POROSITY TO DIRECT MEMORY ELEMENT FORMATION

(75) Inventors: Alexander Nickel, Santa Clara, CA (US); Suzette K. Pangrle, Cupertino, CA (US); Steven C. Avanzino, Cupertino, CA (US); Jeffrey Shields, Sunnyvale, CA (US); Fei Wang, San Jose, CA (US); Minh Tran, Milpitas, CA (US); Juri H. Krieger, Brookline, MA (US); Igor Sokolik, East Boston, MA (US)

(73) Assignees: Spansion LLC, Sunnyvale, CA (US); GlobalFoundries Inc., Grand Cayman, KY (US)

( * ) Notice: Subject to any disclaimer, the term of this patent is extended or adjusted under 35 U.S.C. 154(b) by 929 days.

(21) Appl. No.: 11/110,165

(22) Filed: Apr. 20, 2005

(51) Int. Cl.
*H01L 21/8242* (2006.01)

(52) U.S. Cl. .............................. 438/239; 257/E21.645

(58) Field of Classification Search ............... 438/257, 438/900, 238, 239, 99; 257/225, 260, 261, 257/296, E51.028, E21.171, 2–5, E21.645, 257/E21.647, E21.648, E21.008; 313/500; 977/938, 762
See application file for complete search history.

(56) References Cited

U.S. PATENT DOCUMENTS

| | | | |
|---|---|---|---|
| 6,218,277 B1 * | 4/2001 | Hamamoto | 438/597 |
| 6,656,763 B1 * | 12/2003 | Oglesby et al. | 438/99 |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1 | 9/2004 | Tripsas et al. | |
| 6,803,267 B1 * | 10/2004 | Subramanian et al. | 438/197 |
| 6,825,060 B1 | 11/2004 | Lyons et al. | |
| 6,852,586 B1 | 2/2005 | Buynoski et al. | |
| 6,858,481 B2 | 2/2005 | Krieger et al. | |
| 6,864,522 B2 | 3/2005 | Krieger et al. | |
| 6,878,961 B2 | 4/2005 | Lyons et al. | |
| 6,949,793 B2 * | 9/2005 | Choi et al. | 257/316 |
| 7,129,133 B1 * | 10/2006 | Avanzino et al. | 438/244 |
| 7,208,372 B2 * | 4/2007 | Hsu et al. | 438/257 |
| 7,288,419 B2 * | 10/2007 | Naya | 438/20 |
| 2002/0034626 A1 * | 3/2002 | Liu et al. | 428/312.6 |
| 2002/0076616 A1 * | 6/2002 | Lee et al. | 429/300 |
| 2002/0153160 A1 * | 10/2002 | Hofmann et al. | 174/117 F |
| 2003/0119920 A1 * | 6/2003 | Wang et al. | 518/715 |

(Continued)

*Primary Examiner*—W. David Coleman
*Assistant Examiner*—Latanya Crawford
(74) *Attorney, Agent, or Firm*—Turocy & Watson, LLP

(57) ABSTRACT

Disclosed are methods and systems for improving cell-to-cell repeatability of electrical performance in memory cells. The methods involve forming an electrically non-conducting material having ordered porosity over a passive layer. The ordered porosity can facilitate formation of conductive channels through which charge carriers can migrate across the otherwise non-conductive layer to facilitate changing a state of a memory cell. A barrier layer can optionally be formed over the non-conductive layer, and can have ordered porosity oriented in a manner substantially perpendicular to the conductive channels such that charge carries migrating across the non-conductive layer cannot permeate the barrier layer. The methods provide for the manufacture of microelectronic devices with cost-effective and electrically reliable memory cells.

20 Claims, 9 Drawing Sheets

U.S. PATENT DOCUMENTS

| | | | |
|---|---|---|---|
| 2003/0143398 A1* | 7/2003 | Ohki et al. | 428/398 |
| 2003/0173612 A1* | 9/2003 | Krieger et al. | 257/304 |
| 2003/0179633 A1* | 9/2003 | Krieger et al. | 365/200 |
| 2004/0004485 A1* | 1/2004 | Lee et al. | 324/658 |
| 2004/0026682 A1* | 2/2004 | Jiang | 257/4 |
| 2004/0092050 A1* | 5/2004 | Shuy et al. | 438/20 |
| 2004/0159832 A1* | 8/2004 | Hack | 257/17 |
| 2004/0182600 A1* | 9/2004 | Kawabata et al. | 174/250 |
| 2005/0024934 A1* | 2/2005 | Chen | 365/171 |
| 2005/0045874 A1* | 3/2005 | Xiao et al. | 257/40 |
| 2005/0103744 A1* | 5/2005 | Deng | 216/18 |
| 2005/0219788 A1* | 10/2005 | Chow et al. | 361/305 |
| 2006/0040110 A1* | 2/2006 | Kohmura et al. | 428/446 |
| 2006/0131555 A1* | 6/2006 | Liu et al. | 257/3 |
| 2006/0131560 A1* | 6/2006 | Yang et al. | 257/40 |
| 2006/0134219 A1* | 6/2006 | Martens et al. | 424/489 |
| 2006/0145596 A1* | 7/2006 | Coe | 313/500 |
| 2007/0169814 A1* | 7/2007 | Huck et al. | 136/263 |

\* cited by examiner

ORDERED POROSITY TO DIRECT MEMORY ELEMENT FORMATION

TECHNICAL FIELD

The subject invention generally relates to semiconductor fabrication techniques. More particularly, the subject invention relates to methods and systems for improving memory element formation.

BACKGROUND ART

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Memory devices generally include arrays of memory cells. Each memory cell can be accessed or "read," "written," and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers.

Thus, there is a need in the art for improved methods and systems for fabricating more efficient, reliable, and cost-effective memory cells.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides for directionally controlled formation of charge carrier conducting channels to improve memory element function. More specifically, the subject invention utilizes electrically non-conducting materials having ordered porosity to facilitate ordered formation of active layers. The ordered active layers can form directionally controlled charge carrier conducting channels. The subject invention, by improving electrical performance of memory cells, advantageously provides for the manufacture of reliable and cost-effective semiconductor devices.

One aspect of the subject invention relates to methods that improve the directionality of charge carrier conducting channels. The methods include forming a first electrode over a semiconductor substrate, forming one or more passive layers adjacent to the first electrode, forming at least one electrically non-conducting material layer having ordered porosity over the passive layer to form channels and/or aligned pores, depositing an active material inside or adjacent to the channels and/or aligned pores of the electrically non-conducting material layer, and forming a second electrode adjacent to the active material.

Another aspect of the subject invention relates to providing a memory device having at least one memory cell made of at least two electrodes; one or more passive layers; one or more layers of electrically non-conducting material layers having ordered porosity; and an active material inside and/or adjacent to the ordered porosity of the electrically non-conducting material and between electrodes.

Yet another aspect of the invention relates to providing a memory device with at least one memory cell comprising two electrodes; at least one passive layer; at least one active layer comprising an electrically non-conducting layer with ordered porosity and in which oriented channels can be formed; and a barrier layer. Channels in the active layer can be oriented, for instance, perpendicularly to electrode surfaces to achieve minimization of a distance traveled by ions traversing the active layer. Such orientation can be achieved via application of an electric field to the memory element during formation of the active layer such that electric field lines are formed perpendicularly to electrode surfaces and cause pores in the active layer material to self-align along the field lines. If desired, the barrier layer can be formed of a porous electrically non-conductive material in the presence of a second electric field with field lines running parallel to electrode surfaces, and pores therein can be manipulated to form channels substantially perpendicular to the channels in the electrically non-conductive active layer over which the barrier layer is formed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages, and novel features of the invention will become apparent from the following detailed description of the invention when considered in conjunction with the drawings.

DISCLOSURE OF THE INVENTION

Figure 1:
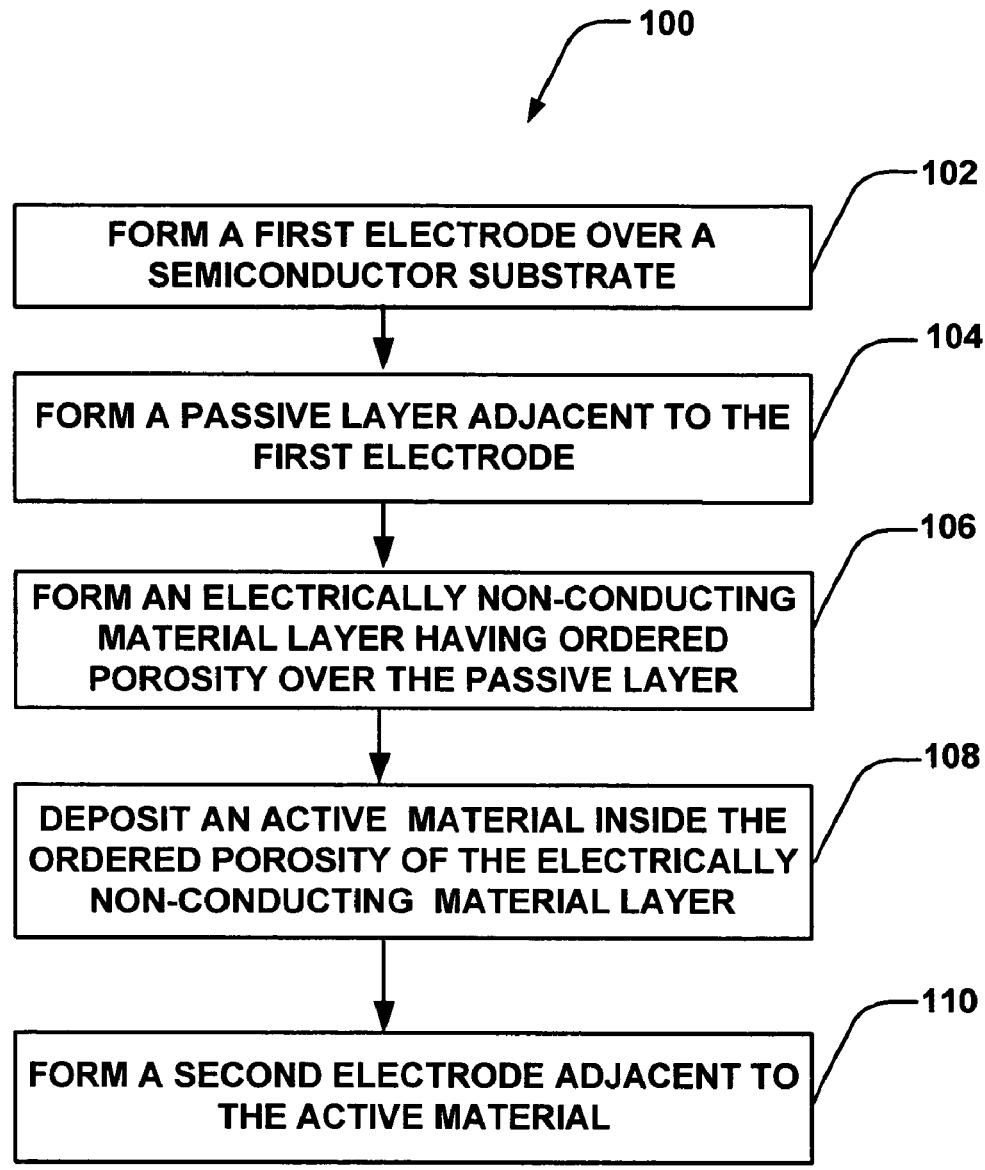
FIG. 1 illustrates a flow diagram of an exemplary methodology according to one aspect of the subject invention.

The subject invention involves methods and systems for improving memory element function of memory cells. The methods involve forming one or more electrically non-conducting material layers having ordered porosity over a passive layer. The ordered porosity of the electrically non-conducting material layer is directed from the passive layer to a top electrode. The electrically non-conducting layer having ordered porosity facilitates ordered formation of active layer, and the orderly formed active layer then provides for directionally controlled formation of charge carrier conducting channels. The conducting channels facilitate migration of charge carriers, and in cases where copper ion is the charge carrier; the conducting channels facilitate growth of copper nanotubes/filaments.

The electrically non-conducting materials having ordered porosity of the subject invention can be any suitable electrically non-conducting material with an ability to form layers with channels or aligned pores. The electrically non-conducting materials having ordered porosity can be organic, inorganic, or organic-inorganic hybrid materials. Examples of electrically non-conducting materials having ordered porosity include carbon nanotubes, zeolite porous films, surfactant templated silicon oxide ($SiO_2$) and methyl silsesquioxane (MSQ) and other silica-like films, porous silicon, and the like.

In one embodiment of the subject invention, the electrically non-conducting material layer having ordered porosity can be zeolite porous films. Zeolites are a class of porous crystalline materials with uniform molecular-sized pores made of hydrated crystalline alumino-silicates containing exchangeable cations of group IA and IIA elements, such as sodium, magnesium, potassium, and calcium. Zeolites can be represented by the formula

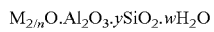

$M_{2/n}O \cdot Al_2O_3 \cdot ySiO_2 \cdot wH_2O$ where M is a metal, n is the cation valence of metal M, y is about 2 or greater, and w is the number of water molecules contained in the voids of zeolites.

Different types of zeolites are available commercially from various suppliers, for example, Zeolyst International, Valley Forge, Pa., U.S.A. Examples of zeolites include silicalite-1, ZSM-5, MF-1, NA, and the like. Zeolite porous films of the subject invention can be formed using any suitable method. In one embodiment, the zeolite porous films are synthesized first and then deposited over a passive layer. In another embodiment, the zeolite films are formed and/or assembled over a passive layer.

Zeolite porous films can be synthesized using any suitable technique, such as in-situ crystallization, vapor phase methods, hydrothermal methods, and seeding methods. A typical procedure to synthesize zeolite porous films involves mixing a silica source and an aluminum source, heating the mixture for a certain time with or without a templating agent. Examples of silica sources include colloidal $SiO_2$, tetraethoxysilane (TEOS), and the like. Examples of aluminum sources include aluminum isopropoxide, aluminum sulfate and the like. Templating agents facilitate formation of specific zeolite structure, and examples of templating agents include tetramethylammonium ion, tetrapropylammonium ion, and the like.

Optionally, calcination can be carried out wherein the zeolites are heated at an appropriate temperature to produce porous structures by removing templating agents. Calcination can be performed at temperatures ranging from about 200° C. to about 900° C.

Zeolite porous films can be formed over a passive layer using any suitable method. For example, zeolite porous films can be deposited using procedures such as spin-on coating, electrophoretic deposition, vapor phase deposition, seeding, and the like. Zeolites below 100 nm can be used as possible seeds for the controlled growth of thin microporous films.

The zeolite porous films can also be formed by self-organization and/or assembly of zeolites. The growth of zeolite films in a self-organized way depends on many different parameters such as the surface of the substrate, the type of the precursors, and the crystallization temperature.

The pore sizes of zeolite films can be controlled by selecting an appropriate zeolite material to form zeolite porous films. The pore size of zeolites is generally defined by the number of metal/oxygen atoms forming a ring or rings in the zeolite crystal structure. The pore sizes of zeolite porous films can be from about 0.05 nm to about 50 nm. The ordered pores of the zeolite films form crystalline channels inside zeolite material. Zeolite films can be formed such that the crystalline channels are oriented perpendicular to a passive layer over which zeolite films are formed.

In another embodiment of the subject invention, the electrically non-conducting material having ordered porosity can be porous silicon with aligned pores. In some embodiments, porous silicon carbide, silicon oxynitride, and/or silicon nitride can also be used. The open pore structure and large specific surface area make porous silicon a convenient material for forming electrically non-conducting material having ordered porosity.

Porous silicon can be formed over the passive layer using any suitable method. For example, porous silicon layer can be formed by pore forming etching of crystalline polysilicon deposited over a passive layer. Pore forming etching can be a partial anodic etching using suitable solvents such as aqueous ethanolic hydrofluoric acid (HF).

In one embodiment, an electrochemical pore forming etching employing dilute HF (for example, a 2.5% solution) is used to produce porous silicon. In another embodiment, an electrochemical pore forming etching using $H_2SO_4$, $H_2O_2$, or any chemical component capable of dissolving silicon (i.e., for example, bromine and fluorine) can be employed to form porous silicon. Porous silicon can also be formed by pore forming stain etching, using $HNO_3$/HF solutions, and by pore forming photochemical etching. Pore forming stain etching is mainly used for making very thin porous silicon layers.

Pore forming etching time to form porous silicon can be adjusted such that the desired porosity is achieved. In one embodiment, pore forming etching time can be from about 0.5 minutes to about 100 minutes. In another embodiment, pore forming etching time to form porous silicon can be from about 2 minutes to about 30 minutes.

The porosity of porous silicon can also be controlled by selecting proper current density during electrochemical pore forming etching. Increasing current density increases porosity of silicon. In one embodiment of the subject invention, the current density during pore forming etching is from about 1 $mA/cm^2$ to about 200 $mA/cm^2$. In another embodiment of the subject invention, the current density is from about 10 $mA/cm^2$ to about 100 $mA/cm^2$.

Pore forming etching results in a system of channels aligned perpendicularly to the substrate on which porous silicon is formed. In one embodiment of the subject invention, a silicon oxide layer may be formed along inside channel walls of porous silicon using suitable methods such as growth or deposition. The silicon oxide facilitates diffusion of charge carriers along the oxide surface of a channel.

The porosity of porous silicon layer may vary through its thickness and/or across the surface of the passive layer. In one embodiment, the final porosity, i.e., percentage of voids of air within the total volume, of the porous silicon layer is from about 30% to about 60%. In another embodiment, the final porosity of the porous silicon layer is about 45% to 55%. In another embodiment of the invention, the voids in the porous silicon are approximately uniformly distributed in porous silicon.

In yet another embodiment of the subject invention, the electrically non-conducting material can be surfactant templated silica and silica-related materials, such as $SiO_2$ and MSQ. Surfactant templated films of the subject invention can have advantageous properties such as porosity, unidimensional channels, desired orientation with respect to a passive layer, insulation, and the like. In surfactant templated films, the pores form ordered (e.g. hexagonal) arrays, with the characteristic pore size being defined by the self-assembled arrays formed by the surfactant.

Surfactant templated silica and/or MSQ or other silica-like films can be formed using known methods. Surfactant templated silica and MSQ can be formed by combining a surfactant (e.g., cetyltrimethylammonium bromide, CTAB) in a silica precursor (e.g., tetramethoxysilane) solution to form a suspension, spin- or dry-coating the suspension to form a film, heating the film to remove the surfactant to form a porous surfactant templated film. In one particular manner, the electrically non-conducting materials having ordered porosity can be sol-gel processed silica and/or silica-like materials. Sol-gel processing offers advantages such as low processing temperature, high homogeneity, and the like. The sol-gel processing of silica and silica materials can be carried out using any known method. For example, a sol-gel technique combined with supercritical fluid extraction can be used to form silica and silica-like materials having ordered porosity.

Typically, the sol-gel process to form silica and silica-like material layer involves two stages: formation of a sol and a gel. A free flowing solution "sol" is first prepared by dissolving a suitable precursor material in a solvent, such as an alcohol, and water, and then reacted with a reagent in presence of a catalyst to form to initiate polymerization of the precursor material from a ternary solution. In one example, silicon alkoxide is mixed with water in ethanol to produce growing chains of Si—O—Si. As polymerization and cross-linking proceed, the "sol" is converted into a "gel." The "gel" can be dried using a suitable method such a heating in dry air or extraction with a supercritical fluid such as $CO_2$. Supercritical fluid drying or extraction removes the liquid from the gel, and involves a solvent exchange with a supercritical fluid, such as $CO_2$, followed by supercritical venting in a specialized autoclave. Known methods can be used to carry out supercritical fluid extraction and/or drying. In another case, the water/solution within the gel can be replaced with an alcohol or other solvent that will replace the surface —OH groups in the gel and allow drying to occur at elevated temperatures but standard pressures. Methods are known for other surface modification processes.

The silica precursors for sol-gel reaction can be either inorganic salts, or organic compounds known as metal alkoxides such as tetraethoxysilane, tetramethoxysilane, and the like. The inorganic precursors of silica can be sodium silicates, potassium silicates, and the like. The catalysts can be either acidic (e.g., HCl) or basic (e.g., ammonia). The microstructure of sol-gel processed silca and silica-like material layer can be controlled by changing water/alkoxide molar ratio, the silica precursor, the catalyst type or concentration, the pH, and the like. The sol-gel processed silica and silica-like materials exhibit sponge like properties with aligned spaces or voids inside.

Any surfactant can be used to form surfactant templated films. For example, cationic, anionic and/or nonionic surfactants can be used. Anionic surfactants that can be used include, but are not limited to, sulfates, sulfonates, phosphates, and carboxylic acids. Cationic surfactants that can be used include, but are not limited to, alkylammonium salts, gemini surfactants, cetylethylpiperidinium salts, and dialkyldimethylammonium. Nonionic surfactants that can be used, with the hydrophilic group not charged, include, but are not limited to, primary amines, poly(oxyethylene) oxides, octaethylene glycol monodecyl ether and octaethylene glycol monohexadecyl ether. The heating to remove the surfactant can be carried at any suitable temperature. For example, the heating can be carried out at a temperature from about 200° C. to about 500° C. Surfactant templated silica and MSQ films available from commercial vendors can also be used for the subject invention.

Surfactant templated films can also be formed using self-assembly routes. Surfactant templated films of the subject invention can be deposited using suitable method in such a way that the desired orientation and porosity are maintained. Examples of methods include spin-on deposition (SOD), dip-coating, spray-coating, evaporation, and the like. The pore size and geometry of surfactant templated films can be controlled by selecting proper concentration of the template, charge of the surfactant, and the processing conditions. The charge carriers (e.g., copper ions) can grow in pores formed in surfactant templated films after removal of surfactants.

In yet another embodiment of the subject invention, the electrically non-conducting materials having ordered porosity can be carbon nanotubes formed over a passive layer. The carbon nanotubes are cylindrical fullerenes built of sheets of graphite (a hexagonal lattice of carbon atoms) rolled into long cylinders. The carbon nanotubes of the subject invention can be either single wall carbon nanotubes or multiwall carbon nanotubes. The carbon nanotubes used in the subject invention are electrically non-conducting.

The carbon nanotubes of the subject invention can be formed using known methods. For example, carbon nanotubes can be formed using plasma enhanced chemical vapor deposition (PECVD), arc discharge, laser ablation, pulsed laser deposition, electron beam deposition, and the like.

The carbon nanotubes of the subject invention can have a suitable diameter. In one embodiment of the subject invention, the diameter of the carbon nanotubes can be greater than about 10 nm. In another embodiment of the subject invention, the diameter of the carbon nanotubes can be more than about 0.25 nm and less than about 1 nm. The carbon nanotubes of the subject invention can have suitable length. For example, the carbon nanotubes can have a length from about 1 nm to about in 100 nm in length.

The carbon nanotubes of the subject invention are aligned perpendicular to the surface of a passive layer on which they are formed. The active materials can be subsequently grown or formed inside the carbon nanotubes along their long axis.

The electrically non-conducting material layer with ordered porosity can provide support for proper aligned growth of an active layer. An aligned active layer can form clear and vertical copper conducting channels, and facilitate ordered growth of copper nanotubes/filaments.

The subject invention may be understood and its advantages appreciated in conjunction with figures and drawings, wherein like numerals represent like features throughout. It is understood that the description of these embodiments are merely illustrative and they should not be taken in a limiting sense. The embodiments of an apparatus or method of the subject invention described herein can be manufactured in a number of different positions and orientations.

The term "charge carrier" in the context of the subject invention refers to ions, electrons, holes, and the like. The term "porosity" refers to the fraction of the sample volume that constitutes pores. The term "ordered porosity" in the context of the subject invention refers to an ordered alignment of the pores in a direction perpendicular, substantially perpendicular, or away from the substrate on which they are formed. The pores may be straight and/or curvilinear.

Referring to FIG. 1, a flow diagram of a method 100 for forming improved memory element films according to one aspect of the subject invention is illustrated. For simplicity of explanation, the methodology is depicted and described as a series of acts. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events. The method 100 involves forming a first electrode layer over a substrate (act 102), forming a passive layer adjacent to the first electrode (act 104), forming an electrically non-conducting material layer with ordered porosity over the passive layer (act 106), depositing an active material inside or adjacent to the electrically non-conducting material layer (act 108), and forming a second electrode over the active material (act 110). Additionally, a barrier layer can be deposited prior to formation of the second electrode as necessitated by design rules, device specifications and the like. The barrier layer can serve to permit current and/or voltage to pass through the memory element while impeding ion migration beyond the upper boundary of the active material, as will be discussed in greater detail with reference to FIGS. 11 and 12.

Figure 2:
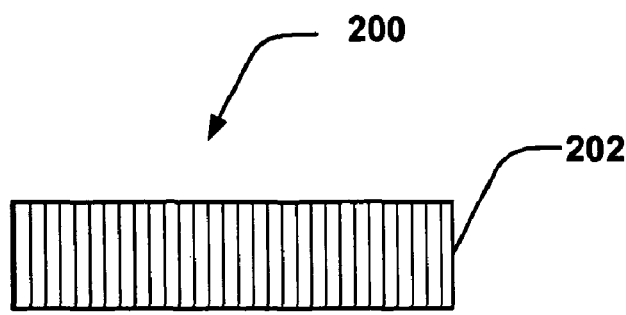
FIGS. 2-7 illustrate cross-sectional views of a memory cell in various states of manufacture in accordance with the methodology described in FIG. 1.

FIGS. 2-7 illustrate a memory cell in various states of manufacture in accordance with the methodology described in FIG. 1. FIG. 2 is a cross-sectional illustration of a semiconducting a substrate 202 utilized to perform the methodology described in FIG. 1. The substrate 202 can be any substrate used in the course of semiconductor processing or any semiconductor surfaces. The substrate 202 is formed using methods known to one skilled in the art. Typically, the substrate 202 is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Figure 3:
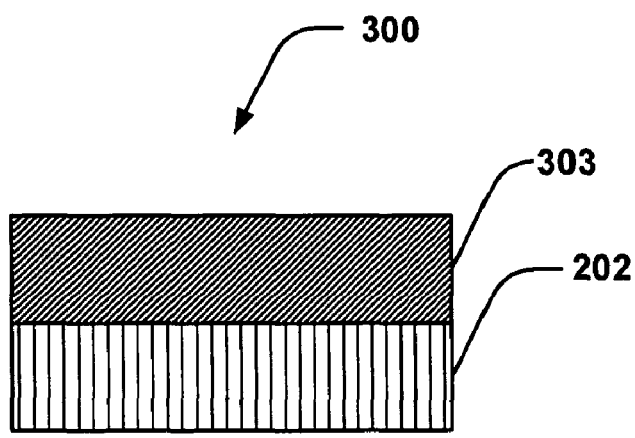

Act 102 of the method 100 is forming a first electrode over the substrate 202. FIG. 3 is a cross-sectional illustration of a memory cell 300 showing the first electrode 303 over the substrate 202. The first electrode 303 is formed using methods known to one skilled in the art. For example, the first electrode 303 is formed by depositing metals using techniques such as etching, evaporation, physical vapor deposition (PVD), chemical vapor deposition (CVD) and plasma enhanced chemical vapor deposition (PECVD).

The first electrode 303 may or may not cover the entire surface of the substrate 202. The first electrode 303 is made of conductive material; such as a conductive metal, conductive metal alloys, conductive metal oxides, conductive polymer films, semiconductive materials, and the like. Specific examples of materials for the first electrode 303 include one or more of aluminum, chromium, cobalt, copper, germanium, gold, magnesium, manganese, molybdenum, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar®, Monel®, Inconel®, brass, stainless steel, magnesium-silver alloy, and various other alloys.

The thickness and width of the first electrode 303 may depend upon the specific lithography and design rules. In one embodiment, the thickness of the first electrode 303 is about 0.01 µM or more and about 10 µm or less. In another embodiment, the thickness of the first electrode 303 is about 0.05 µm or more and about 5 µm or less. One skilled in the art would recognize that the first electrode can be placed in a variety of positions without losing the advantages of the subject invention.

Figure 4:
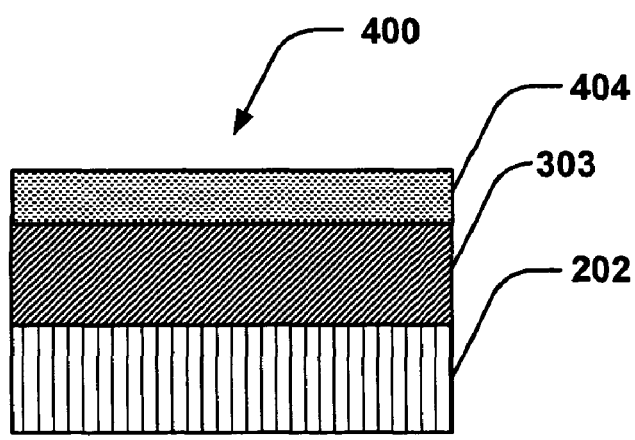

Referring to FIG. 1, act 104 of the method 100 is forming a passive layer. FIG. 4 is a cross-sectional illustration of a memory cell 400 showing the substrate 202, the first electrode 303 and a passive layer 404. The passive layer 404 is formed adjacent to the first electrode 303. The passive layer 404 can be made of at least one conductivity facilitating compound. Examples of conductivity facilitating compounds that may constitute the passive layer 404 include one or more of copper sulfide ($Cu_2S$, CuS), copper rich copper sulfide ($Cu_3S$, CuS; $Cu_3S$, $Cu_2S$), copper oxide (CuO, $Cu_2O$), copper selenide ($Cu_2Se$, CuSe), copper telluride ($Cu_2Te$, CuTe), manganese oxide ($MnO_2$), titanium dioxide ($TiO_2$), indium oxide ($I_3O_4$), silver sulfide ($Ag_2S$, AgS), gold sulfide ($Au_2S$, AuS), iron oxide ($Fe_3O_4$), cobalt arsenide ($CoAs_2$), nickel arsenide (NiAs), and the like. The conductivity facilitating compounds do not necessarily dissociate into ions under the strength of the electric field, although ions may move through them. The passive layer 404 may contain two or more subpassive layers, each sublayer containing the same, different, or multiple conductivity facilitating compounds.

The passive layer 404 is formed using oxidation techniques, gas phase reactions, implantation techniques, or deposited on/between electrodes. In some instances, the passive layer 404 may be treated with a plasma after it is formed. The plasma treatment modifies the energy barrier of the passive layer 404.

In one embodiment, the passive layer 404 containing the conductivity facilitating compound has a thickness of about 0.2 nm or more and about 100 nm or less. In another embodiment, the passive layer 404 has a thickness of about 1 nm or more and about 10 nm or less.

Optionally, before forming the passive layer, a metal layer can be formed over the first electrode. The metal layer can be formed using any suitable conducting metal. In one embodiment of the invention, a metal layer containing at least copper is formed over the passive layer. The metal layer can be formed using similar techniques such as those used to form the first electrode. Additionally, copper can be deposited using electroless deposition, copper seed, electro deposition, and the like.

Referring back to FIG. 1, act 106 of method 100 is forming an electrically non-conducting material layer having ordered porosity over the passive layer. The electrically non-conducting layer having ordered porosity is described hereinabove.

Figure 5:
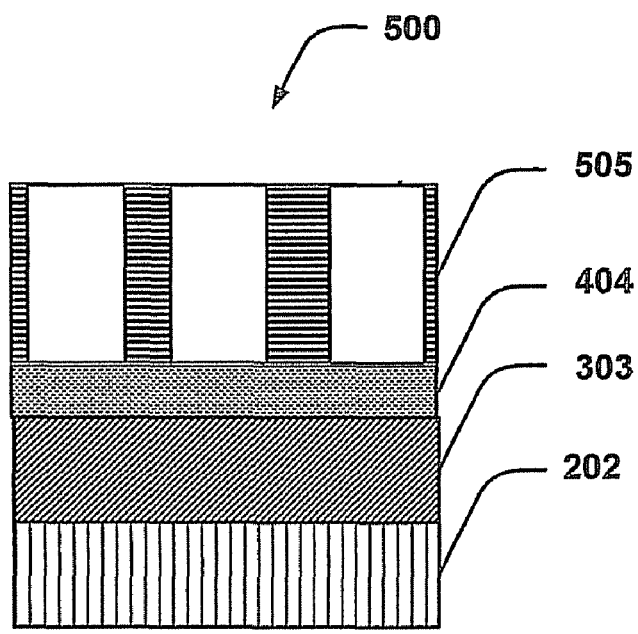

Therefore, the details are not repeated here. FIG. 5 is a cross sectional illustration of a memory cell undergoing fabrication according to one aspect of the subject invention showing an electrically non-conducting layer 505 having ordered porosity formed over the passive layer 505.

The electrically non-conducting material layer can be formed using techniques described above. For example, the electrically non-conducting material layer can be formed using one or more of plasma deposition, spin-coating, electron beam deposition, evaporation, vapor phase deposition, seeding, spray-coating, and the like.

The electrically non-conducting materials of the subject invention are formed in such a way that the pores and/or channels are aligned perpendicular to the surface of the passive layer on which they are formed. The pores and/or channels are oriented towards a second electrode. The channels are aligned parallel in relation to each other.

The electrically non-conducting material layer can have a suitable thickness to facilitate formation of properly aligned active materials. In one embodiment of the subject invention, the electrically non-conducting material layer has a thickness from about 1 nm to about 5000 nm. In another embodiment of the subject invention, the electrically non-conducting material layer has a thickness from about 10 nm to about 1000 nm. In yet another embodiment of the subject invention, the electrically non-conducting material layer has a thickness from about 50 nm to about 500 nm.

The electrically non-conducting material layer of the subject invention can have suitable pore size to support ordered formation of active materials and to maintain the mechanical integrity of the electrically non-conducting material layer. In one embodiment of the subject invention, the pores can be microporous, and can have an average diameter of about 0.05 nm or less. In another embodiment of the subject invention, the electrically non-conducting material layer can be mesoporous with an average pore diameter from about 2 nm to about 50 nm. In yet another embodiment of the subject invention, the electrically non-conducting material layer can be macroporous with an average pore diameter greater than 50 nm.

In some embodiments of the subject invention, the porosity of the electrically non-conducting material layer can also be characterized in terms of surface area. In one embodiment, the surface area of the electrically non-conducting material layer is approximately from about 10 square meters per gram of the electrically non-conducting material to about 500 square meters per gram of the electrically non-conducting material. In another embodiment, the surface area of the electrically non-conducting material layer is approximately from about 50 square meters per gram of the electrically non-conducting material to about 250 square meters per gram of the electrically non-conducting material.

Figure 6:
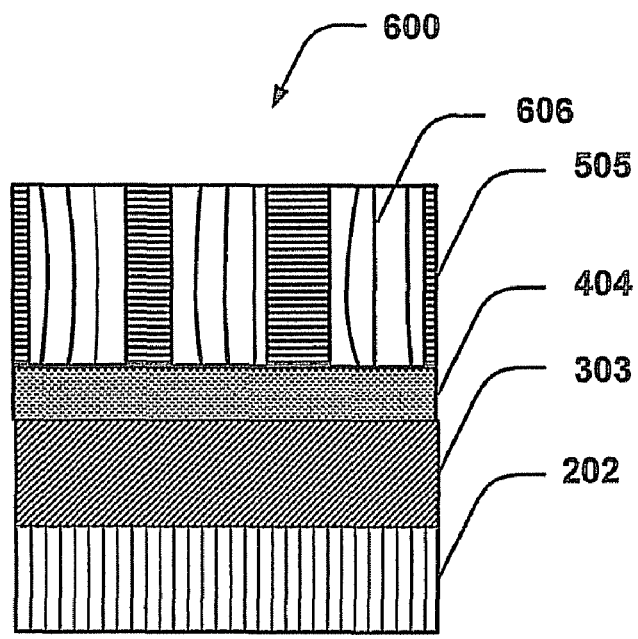

Referring back to FIG. 1, act 108 of method 100 is forming an active material inside or adjacent to the pores/channels of the electrically non-conducting material layer 505. FIG. 6 is a cross-sectional illustration of a memory cell 600 showing the substrate 202, the first electrode layer 303, the passive layer 404, the electrically non-conducting layer having an ordered porosity 505, and an active material 606 inside the ordered porosity of the electrically non-conducting material layer.

The active material of the subject invention can be any suitable semiconducting material or insulating material. Examples of materials that can be used in the formation of the active material include organic semiconducting materials and insulating materials, inorganic semiconducting materials and insulating materials, and mixtures of organic and inorganic semiconducting materials and insulating materials. The active material can be formed using techniques well known to a person in the art.

General examples of the organic semiconducting materials include at least one of an organic polymer (such as a conjugated organic polymer), an organometallic compound (such as a conjugated organometallic compound), an organometallic polymer (such as a conjugated organometallic polymer), a buckyball (e.g., a Buckminsterfullerene and/or variant thereof), a semiconducting carbon nanotube (such as a C6-C60 carbon nanotubes), and the like.

General examples of the semiconducting inorganic materials include transition metal sulfides, chalcogenides, and transition metal oxides. Examples of inorganic materials include copper oxide ($CuO$, $Cu_2O$), iron oxide ($FeO$, $Fe_3O_4$), manganese oxide ($MnO_2$, $Mn_2O_3$, etc), titanium oxide ($TiO_2$).

The active material can also contain a mixture of organic and inorganic materials. The inorganic material (transition metal oxide/sulfide) is usually embedded in an organic semiconductor material. Examples include polyphenylacetylene mixed with $Cu_2S$, polyphenylacetylene mixed with $Cu_2O$, and the like.

In one embodiment of the subject invention, the active material is a semiconducting polymer. The semiconducting polymer can contain one or more semiconducting polymers. The semiconducting polymer can be formed by spin-on techniques (depositing a mixture of the polymer/polymer precursor and a solvent, then removing the solvent from the substrate/electrode), by CVD, optionally including a gas reaction, gas phase deposition, and the like. CVD includes LPCVD, PECVD, and HDCVD. During formation or deposition, the polymer material may self assemble between the electrodes. It is not typically necessary to functionalize one or more ends of the organic polymer in order to attach it to an electrode/passive layer. Examples of semiconducting polymers include conjugated organic polymers, organometallic polymers, carbon structures such as semiconducting carbon nanotubes and buckyballs, and the like.

The organic polymers (or the organic monomers constituting the organic polymers) may be cyclic or acyclic. During formation or deposition, the organic polymer self assembles between the electrodes. Examples of conjugated organic polymers include one or more of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; polydiphenylacetylene; poly(t-butyl)diphenylacetylene; poly(trifluoromethyl)diphenylacetylene; polybis (trifluoromethyl)acetylene; polybis(t-butyldiphenyl) acetylene; poly(trimethylsilyl)diphenylacetylene; poly (carbazole)diphenylacetylene; polydiacetylene; polyphenylacetylene; polypyridineacetylene; polymethoxyphenylacetylene; polymethylphenylacetylene; poly(t-butyl) phenylacetylene; polynitro-phenylacetylene; poly(trifluoromethyl)phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

The active material 606 can be formed to a suitable thickness. In one embodiment, the active material 606 has a thickness of about 0.001 μm or more and about 5 μm or less. In another embodiment, the active material 606 has a thickness of about 0.01 μm or more and about 2.5 μm or less. In yet another embodiment, the active material 606 has a thickness of about 0.05 μm or more and about 1 μm or less.

The organic polymer typically contains a conjugated organic polymer. The polymer backbone of the conjugated organic polymer extends lengthwise between the electrodes. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

Figure 7:
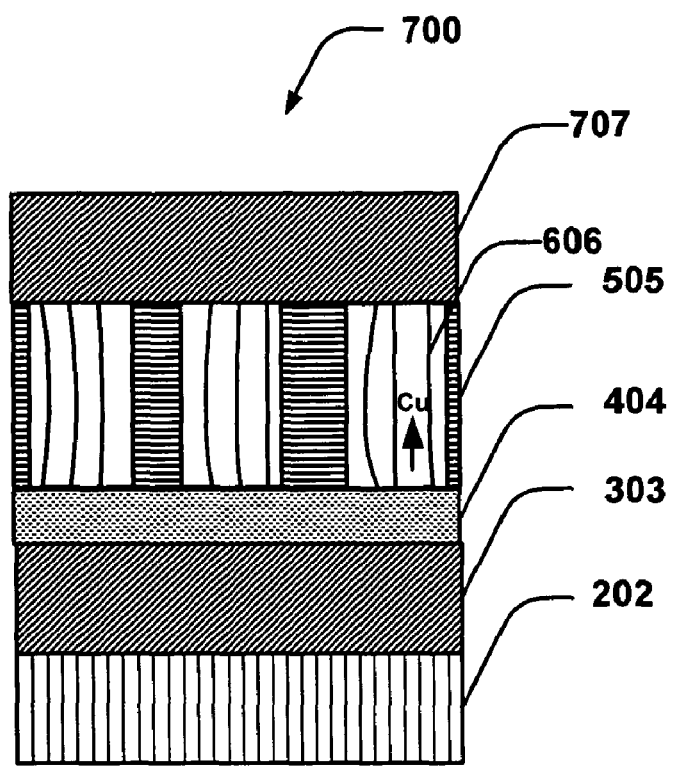

Referring to FIG. 1, act 110 of the method 100 is forming a second electrode. FIG. 7 is a cross-sectional illustration of a cell 700 undergoing the formation of the second electrode 707. The second electrode 707 is formed over the active material 606. The second electrode 707 may be formed in a way similar to that of the first electrode 303, or in a manner different from that of the first electrode 303. In one embodiment, the second electrode 707 includes copper and/or copper containing compounds. In another embodiment, the second electrode may not contain copper and/or copper containing compounds.

After the formation of the second electrode 707, further processing may be carried out on polymer cell/device 700 to achieve a desired pattern and interconnects using techniques well known to persons skilled in the art.

The method 100 is described only as an exemplary embodiment, and it should be noted that a person skilled in the art would appreciate that the advantages of the subject invention can be achieved by modifying and changing the way the method 100 is carried out. For example, it is possible to use more than two electrodes and still maintain the advantages of the subject invention. Similarly, the number, naming and placement of passive layers, active layers, electrodes, and substrate can be modified while maintaining the advantages of the subject invention.

Figure 8:
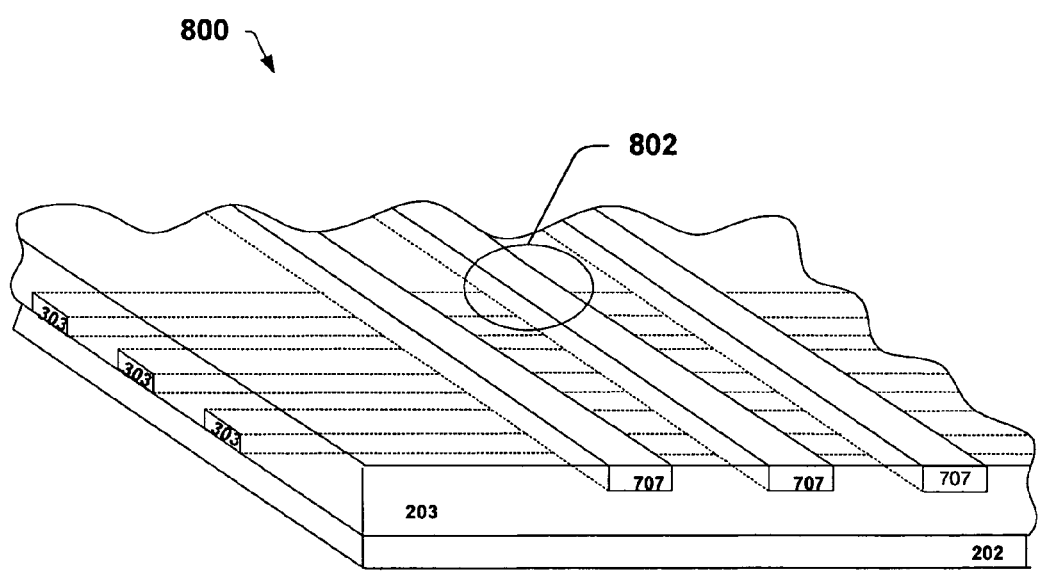
FIG. 8 illustrates an exemplary memory device formed in accordance with one aspect of the subject invention.
Figure 9:
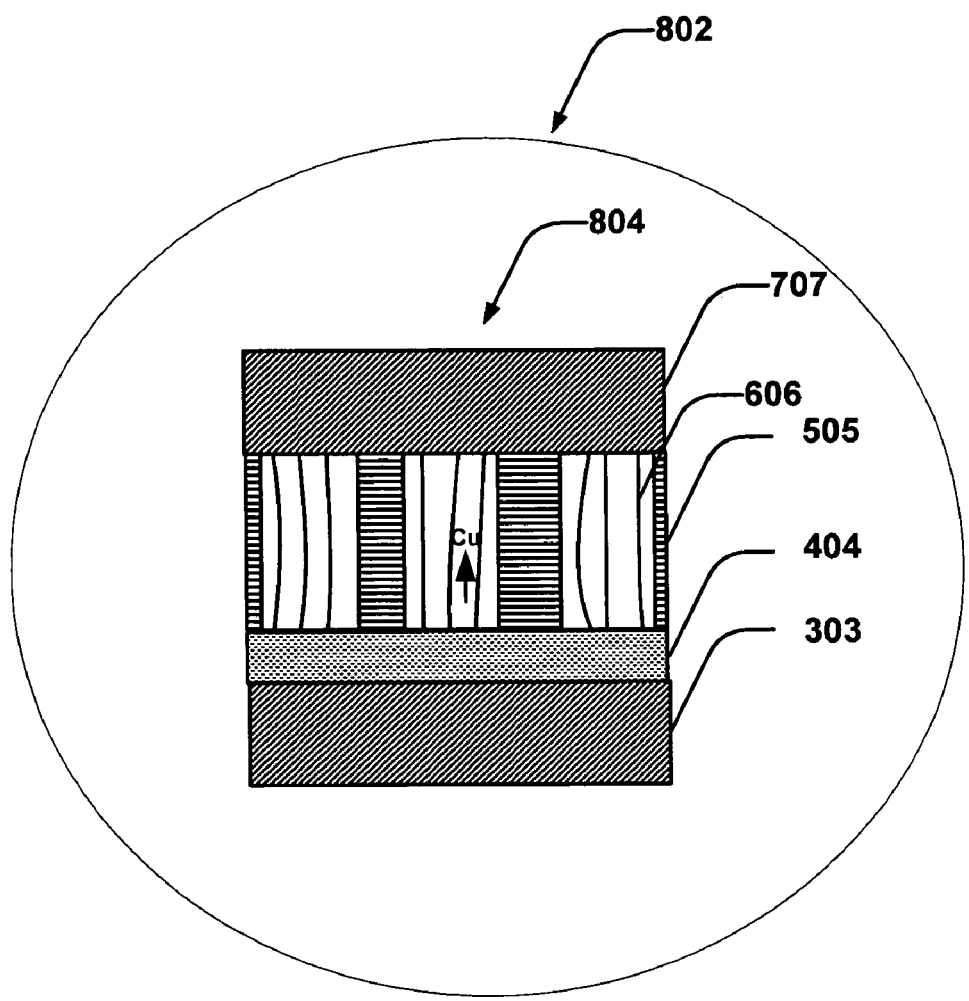
FIG. 9 illustrates an exploded cross-sectional view of an exemplary memory cell as depicted in FIG. 8.

Referring to FIG. 8, a brief description of a microelectronic memory device 800 containing a plurality of memory cells positioned on or over a substrate 202 in accordance with one aspect of the invention is shown. The microelectronic memory device 800 contains a desired number of memory cells, as determined by the number of rows, columns, and layers (three dimensional orientation described later) positioned on a substrate 202. The memory cells are formed in a dielectric 203. The first electrode 303 and the second electrode 707 are shown in substantially perpendicular orientation, although other orientations are possible to achieve the structure of the exploded view 802. FIG. 9 is an exploded view 802 of a memory cell 804 showing a substrate 202, a first electrode 303, a passive layer 404, an electrically non-conducting material layer 505, and a second electrode 707 with an active material 606 therebetween. The electrically non-conducting material layer contains at least one electrically non-conducting material having ordered porosity. The substrate, the dielectric layer, peripheral circuitry, and devices are not shown for brevity.

The passive layer 404, the electrodes 303 and 707, the electrically non-conducting material layer having ordered porosity 505, the active material 606 have been described earlier and all the methods and materials described before can be used to manufacture device 800. The dielectric 203 is formed by techniques known to one skilled in the art. Any suitable dielectric can be used as dielectric 203. Both inorganic and organic dielectrics can be used.

According to another aspect of the subject invention, methods are provided to improve the performance of memory cells in which electrically non-conducting materials of the subject invention can function as active materials to support growth of copper nanotubes/filaments. The method 1000 involves forming a first electrode over a semiconductor substrate, forming one or more passive layers adjacent to the first electrode, forming at least one electrically non-conducting material layer having ordered porosity over the passive layer to form channels and/or aligned pores, and forming a second electrode adjacent to the electrically non-conducting material layer. The electrically non-conducting material layer having ordered porosity can be formed using one or more of the following ways: depositing carbon nanotubes, sol-gel processing of silica and/or silica-like materials, forming surfactant templated $SiO_2$/MSQ films, forming porous zeolite porous films, and forming porous silicon.

Figure 10:
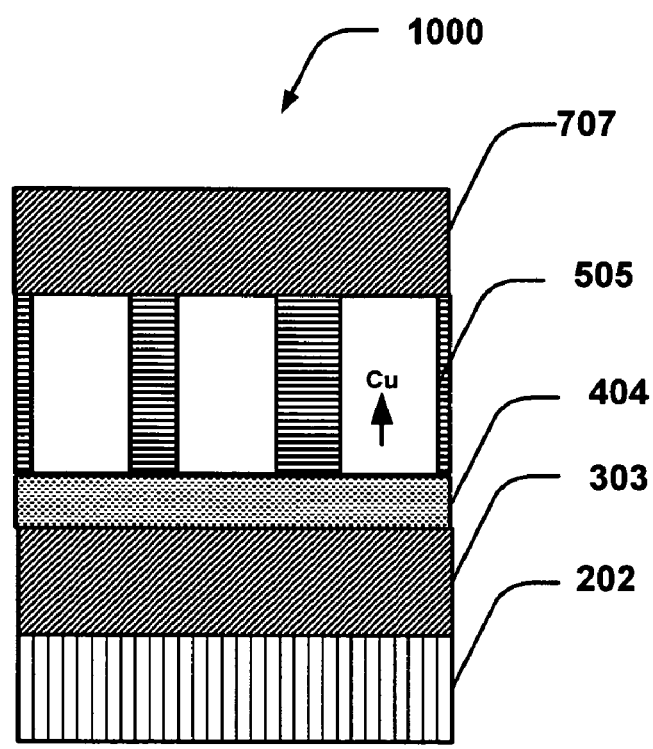
FIG. 10 is a cross sectional illustration of a memory cell undergoing fabrication according to one aspect of the subject invention.

FIG. 10 is a cross sectional illustration of a memory cell 1000 fabricated following an aspect of the subject invention. The methods and materials used to implement methodology 100 can also be used form implement method 100 except that in method 100 the act of forming active materials is omitted. Further, in method 100 the electrically non-conducting material functions as an active material and copper ions can grow in channels or pores of the electrically non-conducting material layer to form copper nanotubes/filaments.

A conductivity facilitating layer and an active material layer and/or an electrically non-conducting material layer having ordered porosity together constitute a memory element film of a memory cell. When an electric field is applied, charge carriers generated in the passive layer migrate towards the top electrode via the active layer and/or the electrically non-conducting material layer having ordered porosity. Conductive channels formed in the active layer and/or the electrically non-conducting material layer having ordered porosity facilitate movement of charge carrier to the top electrode from the passive layer.

An active material and/or an electrically non-conducting material layer having ordered porosity layer along with a passive layer comprises controllably conductive media. The controllably conductive media can be rendered conductive or non-conductive in a controllable manner using an external stimuli. Generally, in the absence of an external stimulus, the controllably conductive media is non-conductive or has high impedance. Further, in some embodiments where the active material contains semiconducting materials, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

Switching the memory cell to the "on" state from the "off" state occurs when an external stimuli such as an applied electric field exceeds a threshold value. Switching the memory cell to the "off" state from the "on" state occurs when an external stimulus exceeds a threshold value of the opposite polarity. The threshold value varies depending upon a number of factors including the identity of the materials that constitute the memory cell and the passive layer, the thickness of the various layers, and the like.

Generally speaking, the presence of an external stimuli such as an applied electric field that exceeds a threshold value ("programming" state) permits an applied voltage to write or erase information into/from the memory cell and the presence of an external stimuli such as an applied electric field that is less than a threshold value permits an applied voltage to read information from the memory cell; whereas external stimuli that do not exceed a threshold value do not write or erase information into/from the organic memory cell.

To write information into the memory cell, a voltage or pulse signal that exceeds the threshold is applied. To read information written into the memory cell, a voltage or electric field of any polarity is applied. Measuring the impedance determines whether the memory cell is in a low impedance state or a high impedance state (and thus whether it is "on" or "off"). To erase information written into the memory cell, a negative voltage opposite in polarity to the writing signal, that exceeds a threshold value, is applied.

Figure 11:
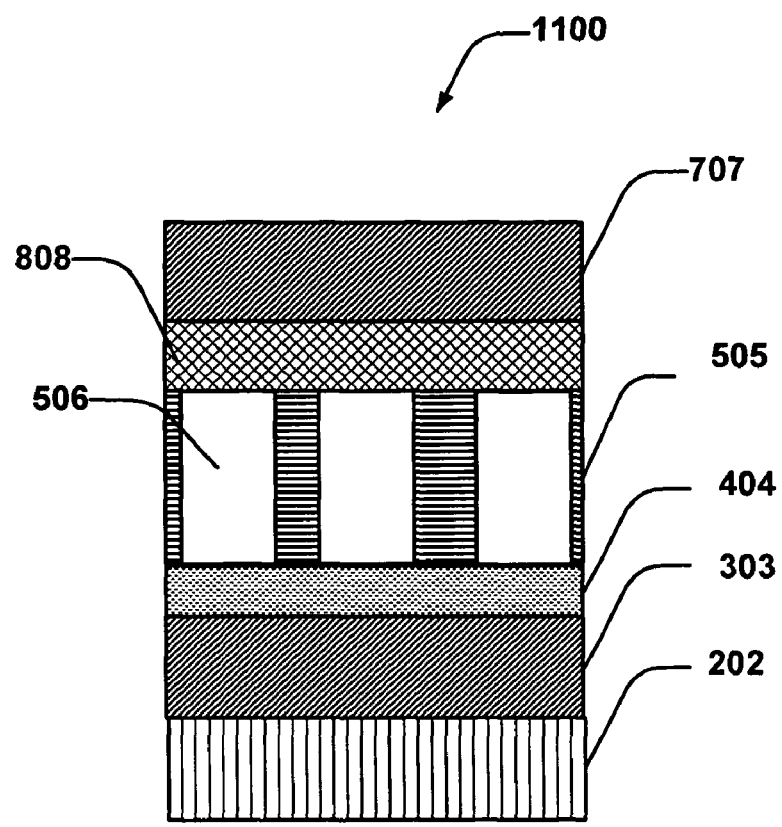
FIG. 11 is a cross-sectional illustration of a memory cell with a barrier layer in accordance with an aspect of the subject invention.

FIG. 11 is an illustration of a memory element 1100 such as can be constructed on a semiconductor chip, comprising an active layer with oriented ion channels formed perpendicularly to electrode surfaces at the top and bottom of the memory element 1100, in accordance with an aspect of the subject invention. For example, a contact 303 can be formed on a substrate 202, and can be exposed to cuprous sulfide in order to form a super-ionic injecting (e.g. passive) layer 404 over the contact 303. The contact 303 can be formed via a single or dual damascene process or the like, as is well understood. The contact (or bottom electrode) 303 can comprise a conductive material such as, copper, copper alloy, or silver alloy. Other materials can be aluminum, chromium, germanium, gold, magnesium, manganese, indium, iron, nickel, palladium, platinum, titanium, zinc, alloys thereof, indium-tin oxide, polysilicon, doped amorphous silicon, metal silicides, and the like. Exemplary alloys that can be utilized for the conductive material include copper-silver alloy, copper-zinc alloy. Other materials can be Hastelloy®, Kovar®, Invar®, Monel®, Inconel®, brass, stainless steel, magnesium-silver alloy, and various other alloys.

The thickness of the bottom contact 303 can vary depending on the implementation and the memory device being constructed. However, some exemplary thickness ranges include about 0.01 µm or more and about 10 µm or less, about 0.05 µm or more and about 5 µm or less, and/or about 0.1 µm or more and about 1 µm or less. The injecting layer 404 comprises at least one conductivity-facilitating compound that contributes to the controllably conductive properties of the selectively conductive media. The conductivity-facilitating compound has the ability to donate and accept charges (holes and/or electrons). Generally, the conductivity-facilitating compound has at least two relatively stable oxidation-reduction states. The two relatively stable states permit the conductivity-facilitating compound to donate and accept charges and electrically interact with an active layer 505 and/or active material in ion channels 506 formed in an otherwise non-conducting active layer. The particular conductivity-facilitating compound employed is selected so that the two relatively stable states match with the two relatively stable states of a conjugated organic molecule of the active material in the ion channels 506.

The injecting layer 404 can in some instances act as a catalyst when forming the active layer 505. In this connection, the backbone of a conjugated organic molecule may initially form adjacent to the injecting layer 404, and grow or assemble away substantially perpendicular to the injecting layer surface. As a result, the backbones of the conjugated organic molecules may be self-aligned.

Examples of conductivity facilitating compounds that can make up the injecting layer 404 include one or more of copper sulfide ($Cu_{2-x}S_y$, CuS), copper oxide (CuO, $Cu_2O$), manganese oxide ($MnO_2$), titanium dioxide ($TiO_2$), indium oxide ($I_3O_4$), silver sulfide ($Ag_{2-x}S_2$, AgS), silver-copper-sulfide complex ($Ag_yCu_{2-x}S_2$), gold sulfide ($Au_2S$, AuS), cerium sulfate ($Ce(SO_4)_2$), ammonium persulfate ($(NH_4)_2S_2O_8$), iron oxide ($Fe_3O_4$), lithium complexes ($Li_xTiS_2$, $Li_xTiSe_2$, $Li_xNbSe_3$, $Li_xNb_3Se_3$), palladium hydride ($H_xPd$) (where x and y are selected to produce desired properties, where $\{0 \leq x \leq 2\}$, and where y is appropriately and/or stoichiometrically selected according to the value of x), and the like. The injecting layer 404 can be grown using oxidation techniques, formed via gas phase reactions, or deposited between the electrodes.

The injecting layer 404 can act as an ion source for the memory cell 1100, such that when the injecting layer 404 is biased, ions will be donated to dope the active layer 505 via migration across the interface between the injecting layer 404 and the active layer 505. Once doped, the active material will exhibit altered conductivity (e.g., typically increased conductivity, or a programmed state) with respect to an undoped state thereof, thus giving rise to two memory states for the memory cell 1100; a programmed state and an erased, or unprogrammed state.

The active layer 505 can be deposited over the injecting layer 404 via conventional methods. The active layer 505 can comprise, for example, a non-conductive porous material in order to facilitate formation of channels 506 within the active layer 505 through which ion migration can occur. For instance, pores in the active layer material can be aligned to form voids, or channels, which can permit charged particles to traverse the active layer 505. Any suitable non-conductive porous material can be utilized in conjunction with invention. Examples of such a material can be, for instance, zeolite porous films, porous silicon, methylsilesquioxane (MSQ), silicon oxide ($SiO_2$), and the like. The active layer 505 can additionally be formed under the influence of an electric field, such that ion channels 506 can be formed via alignment of pores along electric field lines in order to cause the ion channels to be oriented substantially perpendicularly to electrode surfaces. In this manner, the distance traveled by ions during migration is minimized to a substantially straight line, which in turn facilitates achieving a desired result (e.g., programming, erasing, . . . ) in a shorter time than is available using conventional methods that permit random pore alignment.

The active layer 505 has a suitable thickness that depends upon the chosen implementations and/or the memory device being fabricated. Some suitable exemplary ranges of thickness for the active layer 505 are about 0.001 µm or more and about 5 µm or less, about 0.01 µm or more and about 2.5 µm or less, and about a thickness of about 0.05 µm or more and about 1 µm or less.

The active layer 505 can be formed via a number of suitable techniques. One suitable technique that can be utilized is a spin-on technique, which involves depositing a mixture of the material and a solvent, and then removing the solvent from the substrate/electrode. Another suitable technique is chemical vapor deposition (CVD). CVD comprises low-pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer; a chemical bond can be formed between the conjugated organic polymer and the injecting layer 404.

Additionally, the active layer 505 can be formed with ion channels 506 that are oriented in such a manner as to be formed substantially perpendicularly to the surfaces of electrodes 303 and 707 comprised by the memory element 1100. The ion channels 506 can have a diameter in the range of 10-100 Angstroms, without being limited to such diameter(s), and can be oriented along electric field lines traversing the memory element 1100 in order to facilitate ion migration across the active layer 505. According to this aspect of the invention, the migration of metal ions from the injecting layer 404 can be permitted via the ion channels such that metal ions can traverse the active layer 505 until migration is impeded by, for instance, a barrier layer 808. For example, if the injecting layer 404 comprises copper and/or variants thereof, then copper nanotubes can be grown in the ion channels 506 to facilitate conductivity there through. According to a related example, the ion channels 506 can be filled with a polymer that permits and/or facilitates ion migration through the pores.

The barrier layer 808 can be formed over the active layer 505, and can comprise organic or inorganic material. The barrier layer serves to prevent ion migration between the active layer 505 and a top electrode 707, while allowing current and/or voltage to pass through/across the barrier layer 808. In this manner, the barrier layer facilitates achieving a maintainable state of memory (e.g., programmed, unprogrammed, . . . ) in the active layer 505 while permitting electrical manipulation of the memory element 1100 in order to subsequently alter a memory state thereof.

Figure 12:
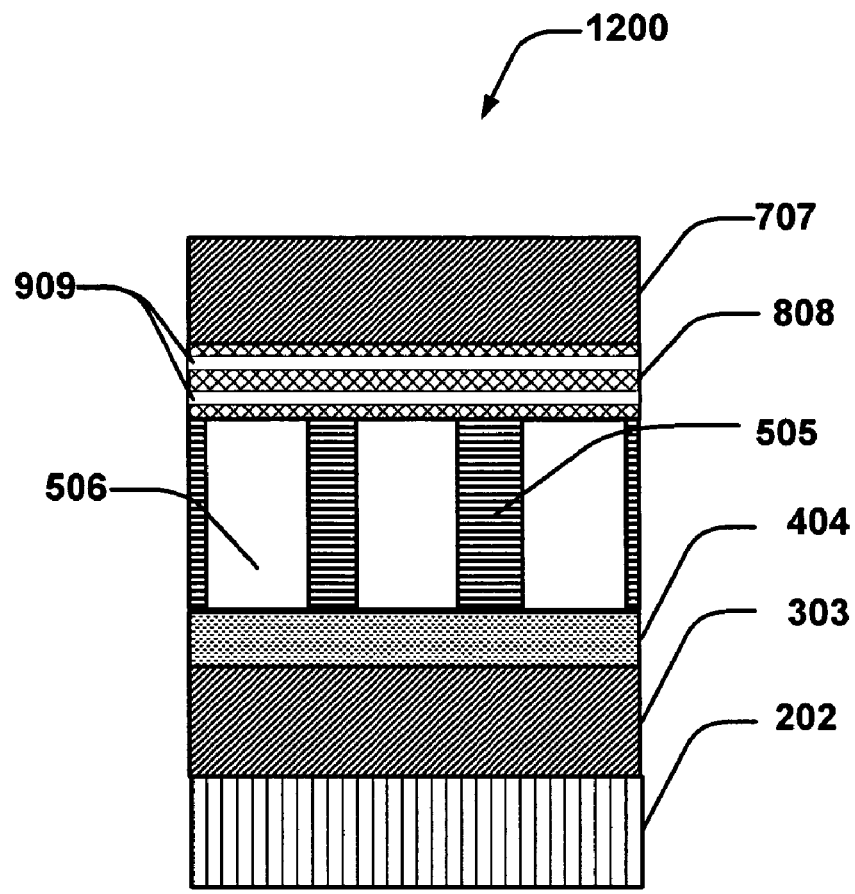
FIG. 12 is a cross-sectional illustration of a memory cell with a barrier layer comprising a porous non-conductive material in which pores are aligned to form channels substantially perpendicular to the ion channels formed in the layer beneath the barrier layer.

FIG. 12 is an illustration of a memory element 1200 that can be constructed on a semiconductor chip, comprising an active layer with ion channels formed perpendicularly to electrode surfaces at the top and bottom of the memory element 1200, and a barrier layer with channels formed parallel to the surfaces of the top and bottom electrodes, in accordance with an aspect of the subject invention. The memory element 1200 comprises a plurality of layers formed on a substrate 202, such as a contact layer 303 and a injecting layer 404 that is deposited upon the contact layer 303. The injecting layer 404 can comprise, for example, cuprous sulfide ($Cu_2S$), or variants thereof, such as are discussed supra with reference to the passive layer described in FIG. 11. Additionally, an active layer 505 can be deposited over the injecting layer 404 to provide state storage functionality to the memory cell 1200. A barrier layer 808 that is impervious to ion dopants can be formed over the active layer 505. A top electrode 707 can be formed over the barrier layer 808 to complete the structure 1200.

The barrier layer 808 can comprises a material that is organic or inorganic, as desired by a manufacturer and/or as dictated by a particular device purpose, and/or can comprises porous or non-porous material. When a porous material (e.g., such as a low-k dielectric material, a zeolite-type polymer, porous silicon, or any other suitable material having a dielectric constant k at or below 3.9, . . . ) is employed for the barrier layer 808, pores 506 can be oriented in a plane parallel to the electrodes 303 and 707 in order to prevent any ion migration across the barrier layer 808.

The ion channels 506 can be constructed along electric field lines (not shown) such that they are substantially perpendicular to the surfaces of the bottom electrode 303 and a top electrode 707 formed over the barrier layer 808. The barrier layer 808 can comprise organic and/or inorganic material(s), and can be formed with or without pores. If the barrier layer 808 comprises porous material, pores and/or channels 909 in the barrier layer can be formed such that they are oriented substantially parallel to the surfaces of the top and bottom electrodes 303 and 707, and/or substantially perpendicular to the ion channels 506 formed in the active layer 505.

The ion channels 506 can have a polymer material filling formed therein, which can be deposited, grown, etc., wherein the polymer filling can facilitate the migration of metal ions across the active layer 505. For example, if the injecting layer 404 comprises copper, then copper nanotubes can be grown in the ion channels 506 to facilitate conductivity across an otherwise non-conductive active layer 505. According to another example, when the active layer 505 is constructed of a non-conductive material, the ion channels 506 can be filled with conductivity-facilitating polymer, such as a conjugated organic polymer.

The polymer filling can comprise a conjugated organic material, which can be linear or branched such that the polymer backbone retains its conjugated nature. Such conjugated molecules are characterized in that they have overlapping π orbitals and in that they can assume two or more resonant structures. The conjugated nature of the conjugated organic materials contributes to the controllably conductive properties of the selectively conductive media, which comprises the injecting layer 404 and the active layer 505 and the ion channels 506 with or without the polymer material.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity-facilitating compound.

The organic material can be cyclic or acyclic. For some cases, such as organic polymers, the organic material self-assembles during formation or deposition. Examples of conjugated organic polymers comprise one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polypyrroles; and the like. Additionally, the properties of the organic material can be modified by doping with a suitable dopant (e.g., a salt). The methods and systems of improving directionality in memory element formation are useful for any semiconductor device utilizing memory cells. For example, the semiconducting devices with improved memory cells are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a memory cell, comprising:
   forming a first electrode over a semiconductor substrate;
   forming a passive layer over the first electrode, the passive layer comprising copper sulfide;
   forming an electrically non-conducting material layer with ordered porosity over the passive layer;
   forming an active material inside the ordered porosity of the electrically non-conducting material layer;
   forming copper nanotubes in the ordered porosity of the electrically non-conducting material layer; and
   forming a second electrode over to the active material.

2. The method of claim 1, the electrically non-conducting material layer comprises one or more of carbon nanotubes, sol-gel processed silica, sol-gel processed silica-like materials, zeolite porous films, porous silicon, surfactant templated silicon oxide films, and surfactant templated methyl silsesquioxane films.

3. The method of claim 1, wherein forming the electrically non-conducting material layer comprises at least one of plasma deposition, spin-coating, electron beam deposition, evaporation, vapor phase deposition, seeding, and spray-coating.

4. The method of claim 1, wherein the ordered porosity of the electrically non-conducting material layer is oriented substantially perpendicularly to the top surface of the first electrode.

5. The method of claim 1, wherein the electrically non-conducting material layer has a thickness from about 1 nm to about 5000 nm.

6. The method of claim 1, wherein the ordered porosity of the electrically non-conducting material layer has an average pore diameter from about 0.05 nm to about 50 nm.

7. The method of claim 1, wherein the active material comprises at least one selected from the group consisting of organic semiconducting polymers, organic insulating materials, inorganic semiconducting materials, inorganic insulating materials, and hybrids of inorganic and organic materials.

8. The method of claim 1, wherein the active material comprises an organic conjugated polymer.

9. The method of claim 1, further comprising applying an electric field to the memory cell during formation of the electrically non-conducting material layer with electric field lines running perpendicularly to the top surface of the first electrode, wherein pores in the electrically non-conducting material layer align themselves along the electric field lines.

10. The method of claim 1, further comprising forming a barrier layer over the electrically non-conducting layer.

11. The method of claim 2, wherein the carbon nanotubes are formed using at least one of arc discharge, laser ablation, chemical vapor deposition, electro beam deposition, and pulsed laser deposition.

12. The method of claim 2, wherein formation of the sol-gel processed silica and sol-gel processed silica-like material comprises use of at least a silica precursor, a catalyst, and a solvent.

13. The method of claim 2, wherein the zeolite porous films are synthesized using at least one of an in situ crystallization method, a seeding method, a vapor phase method, and a hydrothermal method.

14. The method of claim 11, wherein the carbon nanotubes are from about 1 nm to about in 100 nm in length.

15. A method of forming a memory cell, comprising:
   forming a first electrode over a semiconductor substrate;
   forming a passive layer over the first electrode;
   forming an electrically non-conducting material layer with ordered porosity over the passive layer;
   forming an active material inside the ordered porosity of the electrically non-conducting material layer;
   forming a barrier layer having pores therein over the electrically non-conducting layer, the pores being oriented parallel to surfaces of the first and second electrodes; and
   forming a second electrode over to the barrier layer.

16. The method of claim 15, the electrically non-conducting material layer comprises one or more of carbon nanotubes, sol-gel processed silica, sol-gel processed silica-like materials, zeolite porous films, porous silicon, surfactant templated silicon oxide films, and surfactant templated methyl silsesquioxane films.

17. The method of claim 15, wherein the ordered porosity of the electrically non-conducting material layer is oriented substantially perpendicularly to the top surface of the first electrode.

18. The method of claim 15, wherein the passive layer comprises copper sulfide and the method further comprises forming copper nanotubes in the ordered porosity of the electrically non-conducting material layer.

19. The method of claim 15, wherein the active material comprises at least one selected from the group consisting of organic semiconducting polymers, organic insulating materials, inorganic semiconducting materials, inorganic insulating materials, and hybrids of inorganic and organic materials.

20. The method of claim 15, wherein the active material comprises an organic conjugated polymer.

* * * * *